US012660527B2

(12) United States Patent (10) Patent No.: US 12,660,527 B2
Satoh (45) Date of Patent: Jun. 16, 2026

(54) FILM FORMATION METHOD AND PLASMA PROCESSING METHOD

(71) Applicant: Hitachi High-Tech Corporation, Tokyo (JP)

(72) Inventor: Kiyohiko Satoh, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/908,335

(22) PCT Filed: Dec. 17, 2021

(86) PCT No.: PCT/JP2021/046802
§ 371 (c)(1),
(2) Date: Aug. 31, 2022

(87) PCT Pub. No.: WO2023/112320
PCT Pub. Date: Jun. 22, 2023

(65) Prior Publication Data
US 2024/0355616 A1 Oct. 24, 2024

(51) Int. Cl.
H01L 21/02 (2006.01)
H10P 14/60 (2026.01)
H10P 14/692 (2026.01)

(52) U.S. Cl.
CPC ...... H10P 14/6336 (2026.01); H10P 14/6308 (2026.01); H10P 14/6316 (2026.01);
(Continued)

(58) Field of Classification Search
CPC ......... H01L 21/02274; H01L 21/02164; H01L 21/02236; H01L 21/02247; H01L 21/02252; H01L 21/0228; H01L 21/02211; H01L 21/02; H01L 21/0234; H01L 21/308; H01L 21/31; H01L 21/0217; H01L 21/3081; C23C 16/34; C23C 16/40;
(Continued)

(56) References Cited

U.S. PATENT DOCUMENTS 11,393,674 B2 7/2022 Hsieh et al.
2011/0039418 A1 2/2011 Kabe et al.
(Continued)

FOREIGN PATENT DOCUMENTS

JP 2007053276 A 3/2007
JP 2016-143698 A 8/2016
(Continued)

OTHER PUBLICATIONS

Machine translation, WO-2021100560-A1 (Year: 2021).*
(Continued)

*Primary Examiner* — Michael G Miller
(74) *Attorney, Agent, or Firm* — Miles & Stockbridge, P.C.

(57) ABSTRACT

To enable formation of a film that protects a sidewall of a pattern and is good in film quality, low in etching rate, and good in coverage of the sidewall, a film formation method includes a first step of supplying a gas into a vacuum processing chamber while generating plasma, and forming a film with the generated plasma on a surface of a substrate to be processed, a second step of removing halogen with plasma after the first step, and a third step of oxidizing or nitriding the film with plasma after the second step.

18 Claims, 7 Drawing Sheets

(52) U.S. Cl.
CPC ...... *H10P 14/6319* (2026.01); *H10P 14/6339*
(2026.01); *H10P 14/69215* (2026.01)

(58) Field of Classification Search
CPC ... C23C 16/455; C23C 16/345; C23C 16/401;
C23C 16/4554; C23C 16/45553
See application file for complete search history.

(56)                   References Cited

U.S. PATENT DOCUMENTS

| | | | |
|---|---|---|---|
| 2013/0084714 | A1 | 4/2013 | Oka et al. |
| 2015/0110968 | A1 | 4/2015 | Lavoie et al. |
| 2016/0225639 | A1* | 8/2016 | Kihara .............. H01L 21/02274 |
| 2020/0243298 | A1 | 7/2020 | Nishide et al. |
| 2023/0220552 | A1 | 7/2023 | Takeda |

FOREIGN PATENT DOCUMENTS

| | | |
|---|---|---|
| JP | 2020-123646 A | 8/2020 |
| JP | 2020-167166 A | 10/2020 |
| TW | I706464 B | 10/2020 |
| WO | 2009099254 A1 | 8/2009 |
| WO | WO-2021100560 A1 * 5/2021 | ........... C23C 16/045 |

OTHER PUBLICATIONS

Office Action mailed Jan. 13, 2023 in Taiwanese Application No. 111128182.

Office Action mailed Jan. 30, 2024 in Japanese Application No. 2022-552367.

Rowlette et al., "Digital Control of SiO2 Fil m Deposition at Room Temperature", The Journal of Physical Chemistry Letters, 2009, 113, pp. 6906-6909.

Choi et al., "Plasma Enhanced Atomic Layer De position of Al2O3 and TiN", Journal of Korean Physical Society, vol. 42, Feb. 2003, pp. S975-S979.

Search Report mailed Feb. 15, 2022 in International Application No. PCT/JP2021/046802.

Written Opinion mailed Feb. 15, 2022 in International Application No. PCT/JP2021/046802.

Office Action mailed Apr. 14, 2026 in Chinese Application No. 202180009204.X.

* cited by examiner (a)

301
300
}101

(b)

302
301
300

(c)

303
301
300

(d)

304
301
300

(e)

305
301
300

(f)

306
301
300

910

920

930

904

903
902

902

901

901

902

901

910

(a)

(b)

(c)

| | 1010 | 1020 | 1030 | 1040 |
|---|---|---|---|---|
| | As etch | WITH FILM FORMED ON SiO Plasma C 10sec/1pa | WITH FILM FORMED ON SiO Plasma C 60sec/1pa | WITH FILM FORMED ON SiO Plasma C 10sec/6pa |
| 1001 SHAPE AFTER ETCHING 1002 | 1012 1013 1011 1014 | 1022 1023 1021 1024 | 1032 1033 1031 1034 | 1042 1043 1041 1044 |
| UNDERCUT | PRESENT | PRESENT | ABSENT | ABSENT |

FILM FORMATION METHOD AND PLASMA PROCESSING METHOD

TECHNICAL FIELD

The present invention relates to a method for forming a film on a semiconductor substrate and a plasma processing method.

BACKGROUND ART

A semiconductor process recently requires a sidewall protection technique of a pattern which has a fine pitch of less than 10 nm.

Existing film formation techniques are known to include (1) plasma chemical vapor deposition (CVD) in which two or more types of molecules, which are respectively a film-forming species and a reactive species, are simultaneously supplied into a chamber to form a film, and (2) a plasma atomic layer deposition process (plasma ALD process) in which a film-forming species (adsorption species) and a reactive species are alternately supplied, and only the reactive species is ionized or dissociated into neutral radicals for film formation.

Patent literature 1 discloses a technique, in which while neutral radical oxygen is continuously passed, a precursor (silicon-contained gas) is passed and then purged, and then plasma activation is performed.

Patent literature 2 discloses a sequence of typically known plasma ALD.

Nonpatent literature 1 discloses a sequence of plasma-overlap pulse CVD, in which while oxygen ($O_2$) is continuously passed, tetrachlorosilane ($SiCl_4$) is first introduced and then plasma is generated with delay. In this sequence, although film growth rate has no temperature dependence, HF wet etching rate increases (film quality is worsened) at low temperature of 100° C. or lower.

In nonpatent literature 2, FIG. 2 illustrates typically known sequences of ALD and plasma ALD.

CITATION LIST

Patent Literature

PTL 1: US 2015/0110968 A1
PTL 2: US 2013/0084714 A1

Nonpatent Literature

NPTL 1: Pieter C. Rowlette, et al., "Digital Control of SiO2 Film Deposition at Room Temperature", THE JOURNAL OF PHYSICAL CHEMISTRY LETTERS, 2009, 113, 6906-6909.
NPTL 2: Seung-Woo Choi, et al., "Plasma Enhanced Atomic Layer Deposition of Al2O3 and TiN", Journal of Korean Physical Society, 42, February 2003, S975-S979.

SUMMARY OF INVENTION

Technical Problem

The technique disclosed in PTL 1 is a film formation method intermediate between CVD and ALD, in which the precursor is continuously oxidized. The technique is therefore effective for a precursor containing carbon gas that is easily volatized by oxygen, but is less effective for other gas species, presumably resulting in reduction in film quality.

The method disclosed in PTL 2 is advantageous in that appropriately selecting a precursor provides extremely good coverage, but is problematically low in film growth rate.

In the method disclosed in NPTL 1, although etching rate can be improved (reduced) by decreasing film growth rate, there is a tradeoff between film growth rate and etching rate.

In a typical plasma ALD sequence as disclosed in NPTL 2, plasma is generated once per cycle.

When plasma CVD as a conventional film formation technique is used as means for forming a pattern with a fine pitch while protecting a sidewall, overhang is problematically formed in the case of forming a film in a pattern with a fine pitch of less than 10 nm while film growth rate is high. A conventional plasma ALD is problematically low in film growth rate while providing good coverage (there is a tradeoff between film growth rate and coverage).

Further, an aminosilane-based gas species typically used in ALD is highly reactive at normal temperature and thus problematically tends to form a particle.

To form a pattern with a fine pitch of less than 10 nm, it is necessary to satisfy a demand for solving the problems of the existing techniques, i.e., tradeoff between film growth rate and coverage, etching resistance, and a particle, and forming a film being good in film quality, low in etching rate, and good in coverage of a sidewall. However, none of the above-described conventional techniques can satisfy the demand.

The present invention solves the problems of the existing techniques and provides a film formation method and a plasma processing method, which each allow formation of a film that protects a sidewall of a pattern and is good in film quality, low in etching rate, and good in coverage of the sidewall.

Solution to Problem

To solve the problems of the conventional techniques, the present invention provides a film formation method including a first step of supplying a gas into a vacuum processing chamber while generating plasma, and forming a film with the generated plasma on a surface of a substrate to be processed, a second step of removing halogen with plasma after the first step, and a third step of oxidizing or nitriding the film with plasma after the second step.

To solve the problems of the existing techniques, the present invention provides another film formation method including a first step of supplying a gas into a vacuum processing chamber for a predetermined time and then generating plasma, and forming a film with the generated plasma on a surface of a substrate to be processed, a second step of removing halogen with plasma after the first step, and a third step of oxidizing or nitriding the film with plasma after the second step.

To solve the problems of the existing techniques, the present invention provides a plasma processing method including a first step of supplying a gas into a vacuum processing chamber while generating plasma, and forming a film with the generated plasma on a surface of a substrate to be processed, a second step of removing halogen with plasma after the first step, a third step of oxidizing or nitriding the film with plasma after the second step, and a fourth step of performing plasma etching on a film to be processed after the third step.

To solve the problems of the existing techniques, the present invention provides another plasma processing method including a first step of supplying a gas into a vacuum processing chamber for a predetermined time and then generating plasma, and forming a film with the generated plasma on a surface of a substrate to be processed, a second step of removing halogen with plasma after the first step, a third step of oxidizing or nitriding the film with plasma after the second step, and a fourth step of performing plasma etching on a film to be processed after the third step.

Advantageous Effects of Invention

According to the present invention, it is possible to form a film that protects a sidewall of a mask pattern formed on a substrate to be processed and is good in film quality, low in etching rate, and good in coverage of the sidewall.

According to the present invention, a film, which protects a sidewall of a mask pattern formed on a substrate to be processed, can be formed inside of an etching processing apparatus in which the substrate to be processed is subjected to plasma etching processing.

DESCRIPTION OF EMBODIMENT

The present invention provides a method for forming a film on a semiconductor substrate in the case of etching processing with a pattern, having a pitch of 10 nm or less, as a mask, the method allowing a film, which protects a sidewall of a mask pattern and is good in film quality, low in etching rate, and good in coverage of the sidewall, to be formed inside of an etching apparatus.

Specifically, in the present invention, plasma is generated in three steps (plasma A, plasma B, and plasma C) in one cycle while purge is performed with an inert gas in each of periods between the plasma A, plasma B, and plasma C. In the cycle, with the plasma A, a film forming gas (containing silicon and halogen) is used to form a thin layer film of one to several atomic layers on a surface of a pattern, with the plasma B, a gas (containing hydrogen) is used to remove halogen captured in the thin film of one to several atomic layers formed on the surface of the pattern and in the surface of the film, and with the plasma C, an oxidizing or nitriding gas (containing oxygen or nitrogen) is used to oxidize or nitride the thin film of one to several atomic layers formed on the surface of the pattern. The cycle is repeated multiple times, thereby a protective film good in film quality and in coverage is formed on the pattern surface.

As a result, the present invention has achieved a desired film growth rate, a desired etching rate (etching resistance), and desired coverage.

Halogensilane being less reactive at room temperature is used as the film forming gas, thereby it is expected to preferably reduce the amount of a particle generated by, for example, a reaction of an adsorbed gas remaining in a gas pipe with oxygen in the atmosphere.

Plasma is thus generated in three stages for processing, which provides certain effects, such as an increase in film growth rate 50 to 100 times with the first-stage plasma A, improvement in etching resistance with the second-stage plasma B, and improvement in etching resistance and improvement in a real pattern shape (reduction in undercut) with the third-stage plasma C.

One embodiment of the present invention is now described in detail with reference to drawings. In all drawings for explaining the embodiment, components having the same function are designated by the same sign, and duplicated description is omitted.

However, the present invention is to be construed as being without limitation to the contents of the following embodiment. It will be readily understood by those skilled in the art that the specific configuration of the embodiment can be modified or altered within the scope without departing from the idea or the gist of the present invention.

EXAMPLE

Figure 1:
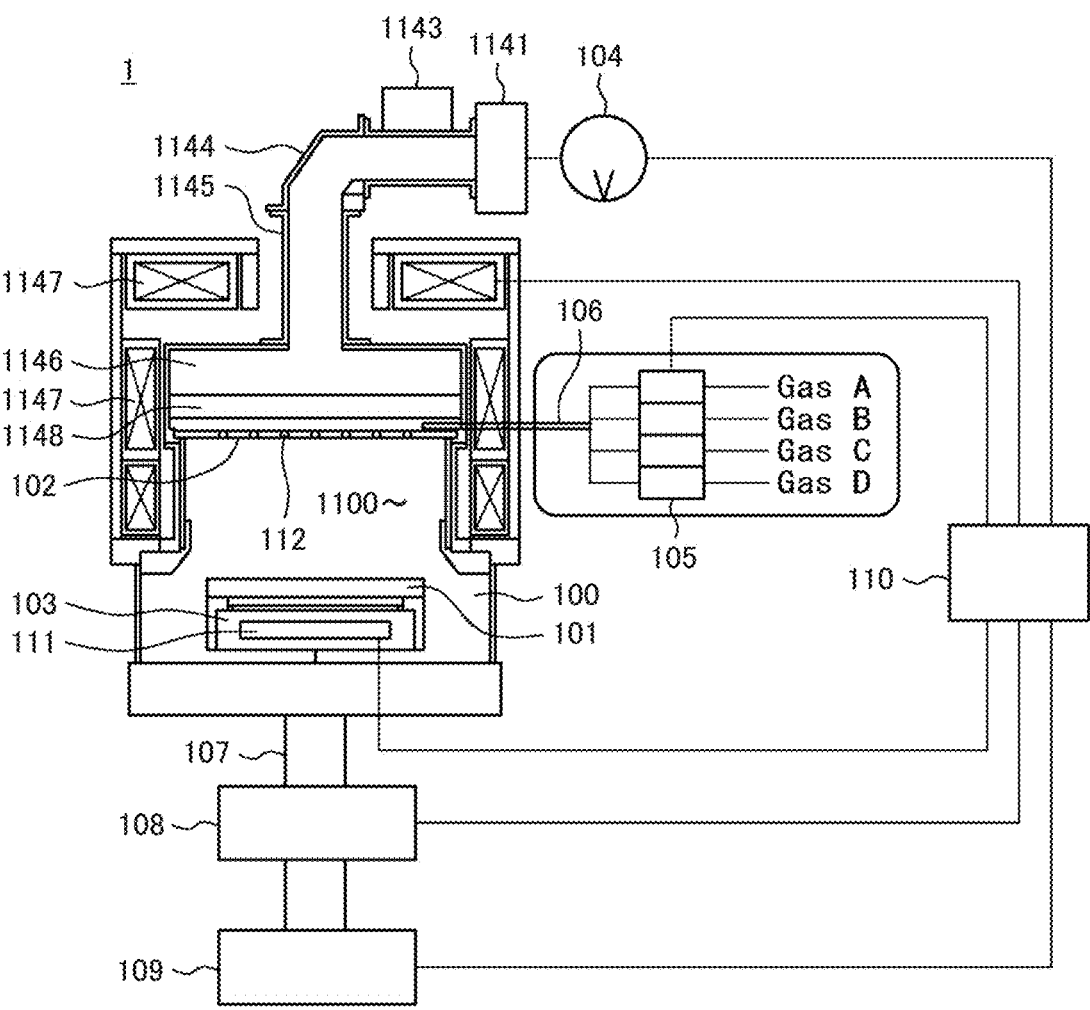
FIG. 1 is a block diagram illustrating a schematic configuration of a plasma processing apparatus according to one example of the present invention.

One example of the embodiment of the present invention is now shown in FIG. 1. FIG. 1 exemplarily shows a configuration of an electron cyclotron resonance (ECR) plasma processing apparatus 1.

The plasma processing apparatus 1 of this example includes a vacuum chamber 100, a shower plate 102 having many holes 112 to supply gas into the vacuum chamber 100, a sample stage 103 internally having a heater 111 and allowing a substrate to be processed 101 to be placed thereon, a plasma generating power source (microwave power source) 104, a microwave generating source 1141 that receives power from the plasma generating power source 104 and generates microwave, a rectangular waveguide 1142 propagating the microwave power generated by the microwave generating source 1141, a microwave matching box 1143 regulating the microwave power propagated within the rectangular waveguide 1142, a converter 1144 to propagate the microwave power, which is propagated within the rectangular waveguide 1142, into a circular waveguide 1145, a cavity room 1146 to resonate the microwave power propagated from the circular waveguide 1145, an electromagnet 1147 to generate a magnetic field in each of the insides of the cavity room 1146 and the vacuum chamber 100, a partition board 1148 made of a dielectric, which is provided between the cavity room 1146 and the vacuum chamber 100 and transmits microwave power while maintaining vacuum in the vacuum chamber 100, a mass flow controller 105 regulating flowrate of a gas supplied into the vacuum chamber 100, a gas line 106 that supplies the gas regulated in flowrate by the mass flow controller 105 to between the shower plate 102 and the partition board 1148, an exhaust pipe 107 for connection with the vacuum chamber 100, a pressure control valve 108 to regulate internal pressure of the vacuum chamber 100, a pump 109 to evacuate the vacuum chamber 100 through the exhaust pipe 107 and the pressure control valve 108, and a controller 110 that controls the heater 111, the plasma generating power source 104, the electromagnet 1147, the mass flow controller 105, the pressure control valve 108, and the pump 109.

In the plasma processing apparatus 1 having such a configuration, the vacuum chamber 100 is evacuated by the pump 109 while the substrate to be processed 101 is placed on the sample stage 103. When the vacuum chamber 100 is evacuated to a predetermined degree of vacuum, the substrate to be processed 101 is heated to a predetermined temperature with the heater 111 in the sample stage 103.

In the state where the substrate to be processed 101 is heated at the predetermined temperature, one or more of at least four types of gases A, B, C, and D is/are supplied, while being regulated in flowrate by the mass flow controller 105 controlled by the controller 110, to between the shower plate 102 and the partition board 1148 through the gas line 106, and further supplied into the vacuum chamber 100 through the holes 112 of the shower plate 102.

In this state, power is applied to the electromagnet 1147 from an undepicted power source to generate a magnetic field inside of the vacuum chamber 100, and plasma is generated using the plasma generating power source 104 in a region 1100 between the shower plate 102 and the sample stage 103 to form a film on the substrate to be processed 101.

This example provides a method for forming a film on a semiconductor substrate, the method allowing a film, which protects a sidewall of a fine pattern and is good in film quality, low in etching rate, and good in coverage of the sidewall, to be formed inside of an etching apparatus, using the plasma processing apparatus 1 as in FIG. 1.

Figure 2:
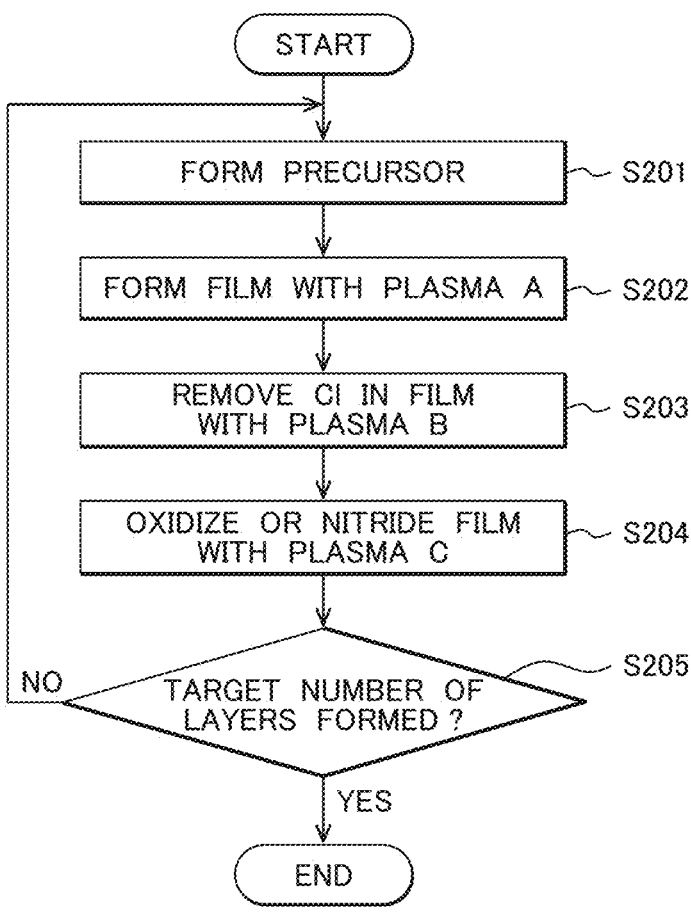
FIG. 2 is a flowchart illustrating an outline of a protective film formation process according to the example of the present invention.
Figure 3:
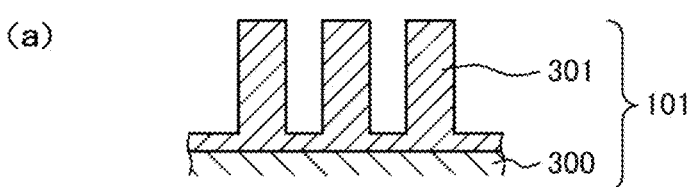
FIG. 3 includes cross-sectional diagrams of a substrate to be processed corresponding to respective protective-film formation steps according to the example of the present invention.
Figure 3:
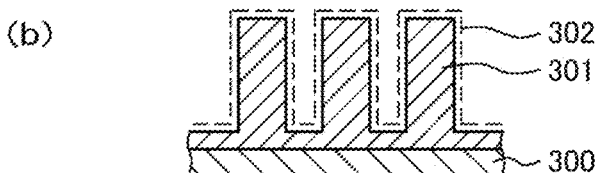
Figure 3:
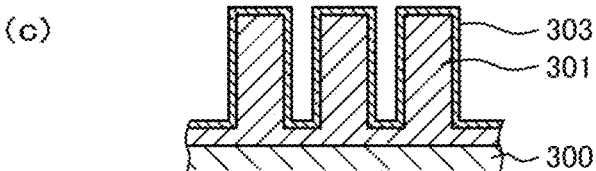
Figure 3:
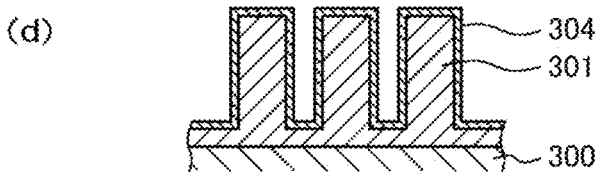
Figure 3:
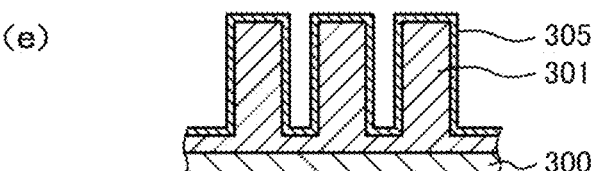
Figure 3:
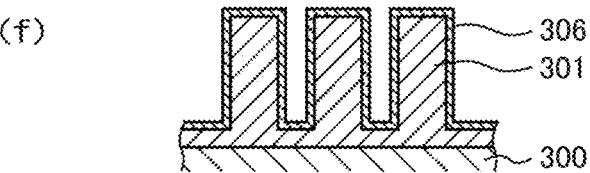

FIG. 2 illustrates a basic flow of processing to form a film for sidewall protection in this example. FIG. 3 illustrates, in correspondence to the basic flow of FIG. 2, cross sectional depth profiles of a silicon (Si) layer 300 on a surface of the substrate to be processed 101 and a pattern 301 to be a mask for etching processing formed on the Si layer 300.

In the processing flow of FIG. 2, the pattern 301 formed on the surface of the objective substrate to be processed 101 has a cross sectional depth profile as shown in FIG. 3(*a*), i.e., has a configuration where the pattern (silicon oxide film pattern) 301 of a silicon oxide film is formed on the Si layer 300.

With such a substrate to be processed 101 as a target, first, gas is passed into the vacuum chamber 100 and adsorbed on the surface of the silicon oxide film pattern 301, thereby a precursor 302 as shown in FIG. 3(*b*) is adsorbed on the surface of the silicon oxide film pattern 301 (S201). Subsequently, plasma A is generated inside of the vacuum chamber 100 to perform first plasma processing on the substrate to be processed 101 having the precursor 302 thereon, so that a film 303 of one or several atomic-layers (FIG. 3(*c*)) is formed on the surface of the silicon oxide film pattern 301 (S202).

Subsequently, plasma B is generated inside of the vacuum chamber 100 so that halogen (such as chlorine) contained in the formed film 303 is removed by second plasma processing (S203).

In addition, plasma C is generated inside of the vacuum chamber 100 to perform third plasma processing on a film 304 from which halogen has been removed (FIG. 3(*d*)), thereby an oxidized or nitrided film 305 (FIG. 3(*e*)) is formed (S204).

The steps from S201 to S204 are repeatedly performed predetermined number of times (S205), thereby a protective film 306 (FIG. 3(*f*)) having a target number of layers is formed on the surface of the silicon oxide film pattern 301.

Figure 4:
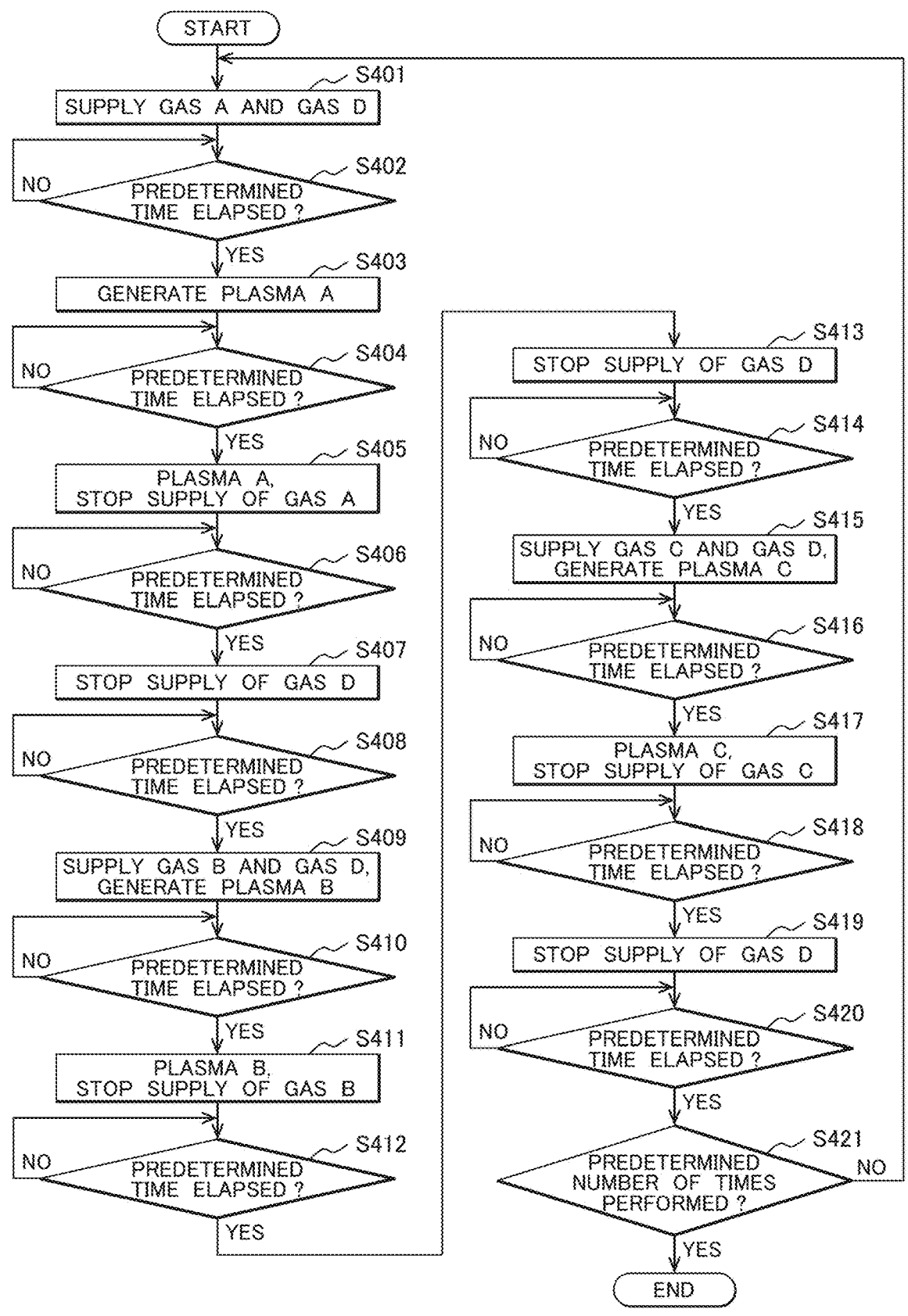
FIG. 4 is a flowchart illustrating detailed protective-film formation steps according to the example of the present invention.

The film formation method of this example as described with reference to FIGS. 2 and 3 is described in detail with a flowchart of FIG. 4 and a timing chart of FIG. 5. In this example, plasma processing is performed in three steps with the at least four types of gases A, B, C, and D.

Figure 5:
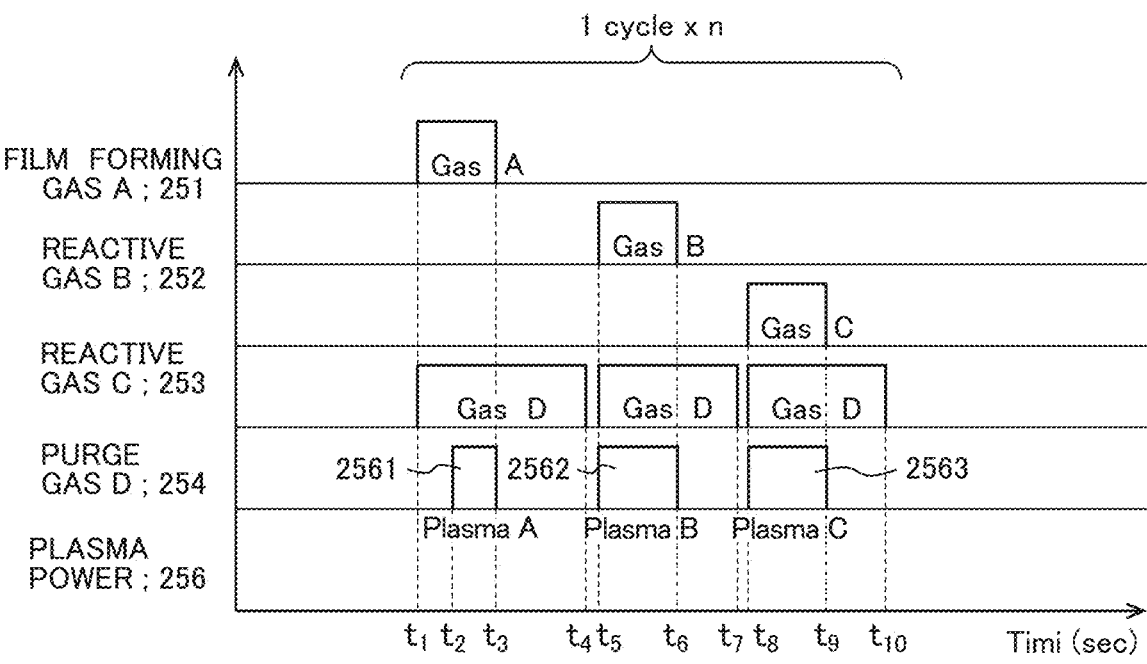
FIG. 5 is a time chart corresponding to the detailed protective-film formation steps according to the example of the present invention.

First, at time $t_1$ in FIG. 5, film forming gas A: 251 and purge gas D: 254 are supplied through the gas line 106 to between the partition board 1148 and the shower plate 102 while flowrate of each gas is regulated by the mass flow controller 105, and the film forming gas A: 251 and the purge gas D: 254 are further supplied into the vacuum chamber 100 through the holes 112 of the shower plate 102 (S401). This state is continued for a predetermined time (until Yes is given in S402).

This step corresponds to a precursor formation step of S201 in the flowchart of FIG. 2, and the substrate to be processed 101 resultantly has a cross sectional depth profile as shown in FIG. 3(*b*).

Subsequently, after a predetermined time has elapsed (Yes in S402), plasma power: 256 is turned on to generate plasma A: 2561 at time $t_2$ (S403). After a predetermined time has elapsed (Yes in S404), plasma power: 256 is turned off to extinguish the plasma A: 2561 and stop supply of the film forming gas A: 251 at time $t_3$ (S405).

Subsequently, while supply of the film forming gas A: 251 is stopped, the purge gas D: 254 is continuously supplied into the vacuum chamber 100, so that internal atmosphere of the vacuum chamber 100 is replaced with the purge gas D: 254. After a predetermined time has elapsed (Yes in S406), supply of the purge gas D: 254 is stopped at time $t_4$ (S407). In this state, the vacuum chamber 100 is evacuated by the pump 109 into a high-vacuum state, and gas remaining within the vacuum chamber 100 is removed from the vacuum chamber 100.

The steps from S403 to S407 correspond to the step of film formation with the plasma A in S202 in the flowchart of FIG. 2, and the substrate to be processed 101 resultantly has a cross sectional depth profile as shown in FIG. 3(*c*).

Subsequently, after a predetermined time has elapsed (Yes in S408), at time $t_5$, a reactive gas B: 252 and the purge gas D: 254 are supplied into the vacuum chamber 100, and the plasma power: 256 is turned on to generate plasma B: 2562 inside of the vacuum chamber 100 (S409).

After this state has been continued for a predetermined time (Yes in S410), at time $t_6$, the plasma power: 256 is turned off to extinguish the plasma B: 2562 and supply of the reactive gas B: 252 is stopped (S411).

Subsequently, while supply of the film forming gas B: 252 is stopped, the purge gas D: 254 is continuously supplied into the vacuum chamber 100, so that internal atmosphere of the vacuum chamber 100 is replaced with the purge gas D: 254. After a predetermined time has elapsed (Yes in S412), supply of the purge gas D: 254 is stopped at time $t_7$ (S413). In this state, the vacuum chamber 100 is evacuated by the pump 109 into a high-vacuum state, and gas remaining within the vacuum chamber 100 is removed from the vacuum chamber 100.

The steps from S409 to S413 correspond to the step of removing halogen such as chlorine in the film with the plasma B in S203 in the flowchart of FIG. 2, and the substrate to be processed 101 resultantly has a cross sectional depth profile as shown in FIG. 3(d).

Subsequently, after a predetermined time has elapsed (Yes in S414), at time $t_8$, a reactive gas C: 253 and the purge gas D: 254 are supplied into the vacuum chamber 100, and the plasma power: 256 is turned on to generate plasma C: 2563 inside of the vacuum chamber 100 (S415).

After this state has been continued for a predetermined time (Yes in S416), at time $t_9$, the plasma power: 256 is turned off to extinguish the plasma C: 2563 and supply of the reactive gas C: 253 is stopped (S417).

While supply of the film forming gas B: 252 is stopped, the purge gas D: 254 is continuously supplied into the vacuum chamber 100, so that internal atmosphere of the vacuum chamber 100 is replaced with the purge gas D: 254. After a predetermined time has elapsed (Yes in S418), supply of the purge gas D: 254 is stopped at time $t_{10}$ (S419). In this state, the vacuum chamber 100 is evacuated by the pump 109 into a high-vacuum state, and gas remaining within the vacuum chamber 100 is removed from the vacuum chamber 100.

The steps from S415 to S419 correspond to the step of oxidizing or nitriding the film with the plasma C in S204 in the flowchart of FIG. 2, and the substrate to be processed 101 resultantly has a cross sectional depth profile as shown in FIG. 3(e).

Subsequently, after a predetermined time has elapsed (Yes in S420), whether the steps from S401 to S420 are repeatedly performed the predetermined number of times is checked (S421), and if the steps have not yet been performed the predetermined number of times (No in S421), the flow is returned to S401, and the series of steps are performed. If the steps have been performed the predetermined number of times (Yes in S421), the protective film formation process is ended.

The steps from S401 to S420 correspond to the steps from S201 to S204 in the flowchart of FIG. 2, and the substrate to be processed 101 has a cross sectional depth profile as shown in FIG. 3(f) when Yes is given in S421.

The film forming gas A: 251 (Gas A in FIG. 1) contains silicon and halogen, and, for example, tetrachlorosilane is used as the gas A. The reactive gas B: 252 (Gas B in FIG. 1) is to remove the halogen, and, for example, hydrogen is used as the gas B. The reactive gas C: 253 (Gas C in FIG. 1) is to induce oxidization, nitridation, or carbonitriding, and, for example, oxygen is used as the gas C. The purge gas D: 254 (Gas D in FIG. 1) is an inert gas, and, for example, argon is used as the gas D.

In this example, as illustrated in FIG. 1, the mass flow controller 105 is provided for each gas system to achieve a desired film quality as described later.

The gas species of tetrachlorosilane as the film forming gas A: 251, hydrogen as the reactive gas B: 252, oxygen as the reactive gas C: 253, and argon as the purge gas D: 254 merely exemplarily shown. For example, a gas species such as dichlorosilane, trichlorosilane, dimethyldichlorosilane, trimethylchlorosilane, or methyltrichlorosilane can be used as the film forming gas A: 251. Similarly, a hydrogen-contained gas such as ammonia can be used as the reactive gas B: 252 to remove the halogen. As the reactive gas C: 253, when an oxide film is desired to be formed, a gas containing oxygen, such as carbon monoxide, carbon dioxide, and oxygen nitride ($NO_2$), is used. When a nitride film is desired to be formed, a gas containing nitrogen, such as nitrogen and ammonia, is used. When a carbonitrided film is desired to be formed, a mixed gas including, for example, methane and nitrogen is used. Further, a gas such as helium can be used as the purge gas D: 254.

Although the time $t_1$, as start time of supplying the film forming gas A: 251 into the vacuum chamber 100, is desirably differentiated from the time $t_2$, at which the plasma A: 2561 is generated, so that film formation is performed after gas is sufficiently adsorbed on the internal surface of the vacuum chamber 100, the time $t_1$, as start time of supplying the film forming gas A: 251 into the vacuum chamber 100, may be the same as the time $t_2$, at which the plasma A: 2561 is generated.

Although an example of electron cyclotron resonance (ECR) has been shown for the configuration of the plasma processing apparatus 1 illustrated in FIG. 1, a usable plasma source may include a capacitively coupled plasma (CCP) source and an inductively coupled plasma (ICP) source.

Figure 6:
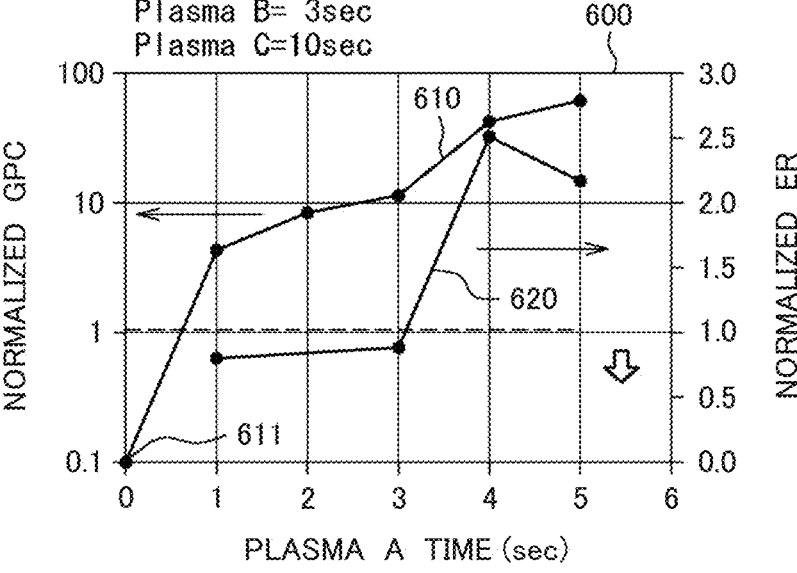
FIG. 6 is a graph illustrating a correlation between plasma A time and normalized growth per cycle (GPC) and a correlation between the plasma A time and normalized etching rate (ER) according to the example of the present invention.

A graph 600 of FIG. 6 shows plasma A: 2561 time dependence of normalized growth per cycle (GPC) 610 obtained by dividing, for normalization, a film growth rate of a film, which is formed using the plasma processing apparatus 1 of FIG. 1 based on the processing flows and the time chart in this example as shown in FIGS. 2 to 5, by a desired film growth rate as a reference, and plasma A: 2561 time dependence of normalized dry etching rate (normalized ER) 620, which is obtained by dividing, for normalization, a dry etching rate of the formed film by a desired dry etching rate as a reference.

The following etching condition is used for measurement of the dry etching rate. That is, a gas of $CF_4/CHF_3$ is used, anisotropic etching is performed using a substrate bias, duration of the plasma B: 2562 (time from $t_5$ to $t_6$ in FIG. 5) is 3 sec, and duration of the plasma C: 2563 (time from $t_8$ to $t_9$ in FIG. 5) is 10 sec. A normalized value, at which the normalized GPC or the normalized ER as the vertical axis is 1, is a target value, and it is desirable that the normalized GPC 610 is 1.0 or more (equal to or higher than the target value) and the normalized ER 420 is 1.0 or less (equal to or lower than the target value).

FIG. 6 reveals that the normalized GPC 610 with the plasma A: 2561 (data of 1 sec or more of plasma A time as the horizontal axis in FIG. 6) is 50 times or more of the normalized GPC 611 without the plasma A: 2561 (data of 0 sec of plasma A time as the horizontal axis in FIG. 6), and that the normalized GPC 610 moderately increases while the normalized ER 620 abruptly increases at duration of the plasma A: 2561 of 4 sec or longer.

Since lower normalized ER 620 is better for a film for sidewall protection, a window, in which both the film growth rate and the etching rate are satisfactorily obtained, exists in the duration of the plasma A: 2561 (time from $t_2$ to $t_3$ in FIGS. 5) of 1 to 3 sec.

Figure 7:
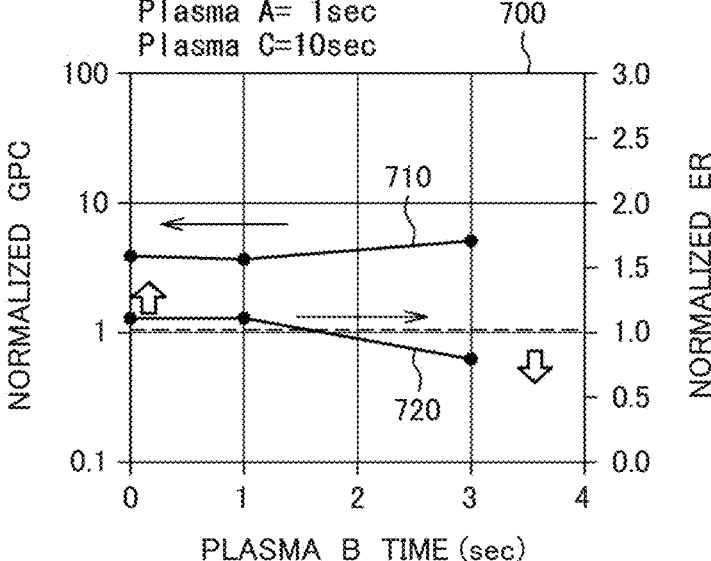
FIG. 7 is a graph illustrating a correlation between plasma B time and normalized GPC and a correlation between the plasma B time and normalized ER according to the example of the present invention.

A graph 700 of FIG. 7 shows plasma B: 2562 time dependence of normalized GPC 710 of a film formed using the plasma processing apparatus 1 of FIG. 1 based on the processing flows and the time chart in this example as shown in FIGS. 2 to 5, and plasma B: 2562 time dependence of normalized ER 720 of the film. The following etching condition is used for measurement of the dry etching rate. That is, a gas of CF4/CHF3 is used, anisotropic etching is performed using a substrate bias, the duration of the plasma A: 2561 is 1 sec, and the duration of the plasma C: 2563 is 10 sec.

The graph 700 reveals that the normalized GPC 710 is slightly affected by the duration of the plasma B: 2562 and substantially constant, but the normalized ER 720 decreases to the normalized value or lower (1 or less) at the duration of the plasma B: 2562 of 3 sec or more.

Figure 8:
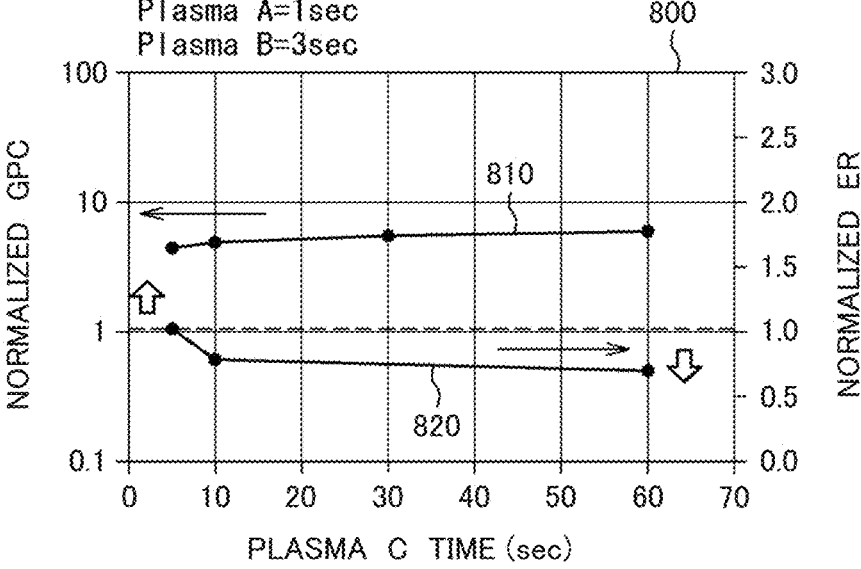
FIG. 8 is a graph illustrating a correlation between plasma C time and normalized GPC and a correlation between the plasma C time and normalized ER according to the example of the present invention.

A graph 800 of FIG. 8 shows plasma C: 2563 time dependence of normalized GPC 810 of a film formed using the plasma processing apparatus 1 of FIG. 1 based on the processing flows and the time chart in this example as shown in FIGS. 2 to 5, and plasma C: 2563 time dependence of normalized ER 820 of the film. The following etching condition is used for measurement of the dry etching rate. That is, a gas of CF4/CHF3 is used, anisotropic etching is performed using a substrate bias, the duration of the plasma A: 2561 is 1 sec, and the duration of the plasma B: 2562 is 3 sec.

The graph 800 reveals that the normalized GPC 810 is slightly affected by the duration of the plasma C: 2563 and substantially constant, but the normalized ER 820 is lower than the normalized value (the normalized ER 820 as the vertical axis is 1) at the duration of the plasma C: 2563 of 10 sec or more.

The above results reveal that the following relationship needs to be satisfied between tA, tB, and tC, where tA represents duration of the plasma A: 2561, tB represents duration of the plasma B: 2562, and tC represents duration of the plasma C: 2563.

tA=1 to 3 sec, and tA≤tB≤tC

Figure 9:
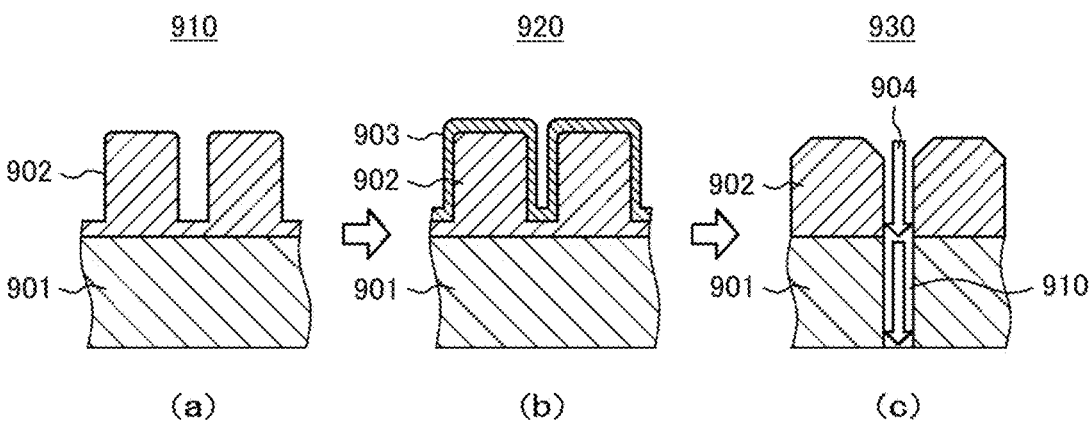
FIG. 9 includes diagrams each illustrating a flow of etching processing using a protective film according to the example of the present invention.

FIG. 9 illustrates cross sectional depth profiles of a pattern having a film on its surface in respective steps when etching processing is performed on the pattern, the film being formed using the plasma processing apparatus 1 of FIG. 1 based on the processing flows and the time chart in this example as shown in FIGS. 2 to 5.

FIG. 9(a) illustrates a cross section of a pattern before formation of a multilayer film in this example, the cross section corresponding to the pattern cross sectional depth profile (a) described with FIG. 3, and having a configuration where a silicon oxide film pattern 902 (corresponding to the silicon oxide film pattern 301 in FIG. 3) is formed on a silicon (Si) layer 901 (corresponding to the Si layer 300 in FIG. 3).

FIG. 9(b) illustrates a cross section of a pattern after forming the multilayer film in this example as described with FIGS. 2 to 5, i.e., the cross section corresponding to the pattern cross sectional depth profile (f) described with FIG. 3, and showing a state where a multilayer protective film 903 (corresponding to the protective film 306 in FIG. 3(f)) is formed on a surface of the silicon oxide film pattern 902.

FIG. 9(c) illustrates a state where the pattern after forming the multilayer film in this example as described in FIGS. 2 to 5 is subjected to etching processing, so that a trench pattern (or a hole pattern) 910 is formed so as to reach the Si layer 901. The above-described CF$_4$/CHF$_3$ mixed gas is used in an etching condition of the silicon oxide film pattern 902, and chlorine gas is used in an etching condition of the Si layer 901. An arrow 904 indicates a direction in which processing proceeds faster when the silicon oxide film pattern 902 and the Si layer 901 are processed by etching processing in the case of anisotropic etching using a substrate bias.

Formation of the multilayer film of FIG. 9(b) and the etching processing of FIG. 9(c) can be performed using the same plasma processing apparatus.

Figure 10:
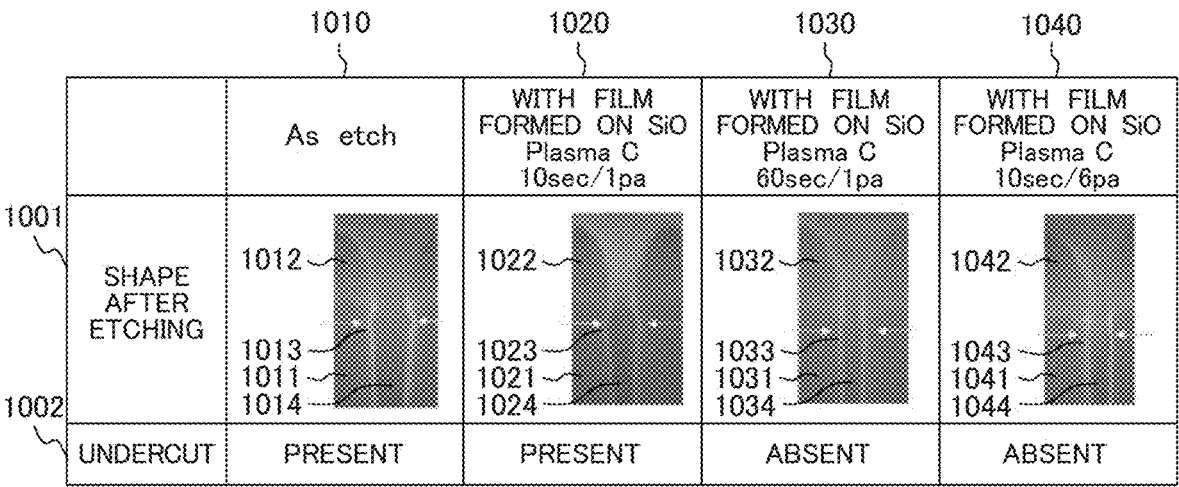
FIG. 10 illustrates a correlation between plasma C time, pressure of plasma C, and undercut, where the plasma C is generated in etching processing on a pattern having thereon a protective film according to the example of the present invention, and the undercut is formed during subsequent etching processing.

FIG. 10 illustrates a relationship between each etching condition and a cross sectional depth profile 1001 of a formed pattern and a relationship between the etching condition and presence of an undercut 1002 in the case where etching processing is actually performed while time and pressure of the plasma C are varied in the step of FIG. 9(c).

Here, 1010 shows a state of as etch, i.e., respective cross sectional depth profiles of a silicon (Si) layer 1011 and a silicon oxide film pattern 1012 in the case where a trench pattern 1014 is formed by etching a pattern having thereon no protective film (the protective film 306 in FIG. 3(f) or the protective film 903 in FIG. 9) described in this example. As shown in this figure, if the protective film described in this example is not formed, a recess 1013 is formed in the vicinity of a boundary between the Si layer 1011 and the silicon oxide film pattern 1012 (spacer) in a portion having the trench pattern 1014, showing presence of the undercut 1002.

In addition, 1020 shows a case where a trench pattern 1024 is formed through etching processing with duration tC of the plasma C: 2563 of 10 sec and internal pressure of the vacuum chamber 100 of 1 Pa. In this case, as with 1010, a recess 1023 is formed in the vicinity of a boundary between a Si layer 1021 and a silicon oxide film pattern 1022 (spacer) in a portion having the trench pattern 1024, showing presence of the undercut 1002.

In contrast, as shown in 1030, when a trench pattern 1034 is formed through etching processing with duration tC of the plasma C: 2563 of 60 sec and internal pressure of the vacuum chamber 100 of 1 Pa, no recess is formed in the vicinity 1033 of a boundary between a Si layer 1031 and a silicon oxide film pattern 1032 (spacer) in a portion having the trench pattern 1034, showing no undercut 1002.

As shown in 1040, when a trench pattern 1044 is formed through etching processing with duration tC of the plasma C: 2563 of 10 sec and internal pressure of the vacuum chamber 100 of 6 Pa, as with 1030, no recess is formed in the vicinity 1043 of a boundary between a Si layer 1041 and a silicon oxide film pattern 1042 (spacer) in a portion having the trench pattern 1044, showing no undercut 1002.

As described above, the results of 1030 and 1040 show that etching processing can be performed without the undercut 1002 by performing the etching processing under a condition of tC*pC≥60 (sec·Pa), where tC represents duration of the plasma C: 2563, and pC represents internal pressure of the vacuum chamber 100.

The results show that the multilayer film formed in this example as described with FIGS. 2 to 5 can be used to form a trench or a hole pattern in the Si layer without any undercut by etching processing with the silicon oxide film pattern as a mask.

According to this example, a film, which protects a sidewall of a mask pattern formed on a substrate to be processed, is formed inside of an etching processing apparatus in which the substrate to be processed is subjected to plasma etching processing, thereby a formation process of the film for sidewall protection and an etching processing can be continuously performed in the same apparatus.

It is also possible to reduce damage to a base material or improving coverage through the following procedure: A plasma processing apparatus, which has a structure as disclosed in Japanese Unexamined Patent Application Publication No. 2019-176184 being a previous patent literature, is used, and while an ECR plasma surface is varied in the same vacuum chamber, the respective amounts of ions and radicals of the plasma A, B, or C are controlled such that, for example, the ion amount is larger than the radical amount for the plasma A while the ion amount is smaller than the radical amount for the plasma B and for the plasma C, or conversely the ion amount is smaller than the radical amount for the plasma A while the ion amount is larger than the radical amount for the plasma B and for the plasma C.

According to this example, a pattern good in coverage can be formed at a desired film growth rate and at a desired etching rate (with desired etching resistance).

According to this example, halogensilane low in reactivity at room temperature is used as a film forming gas, thereby, for example, it is expected to reduce the amount of a particle generated by a reaction of adsorbed gas remaining in a gas pipe with oxygen in the atmosphere.

According to this example, plasma is generated in three stages for processing, which achieves the effects, including an increase in film growth rate 50 to 100 times or more for the plasma A in the first stage, improvement in etching resistance for the plasma B in the second stage, and improvement in etching resistance and improvement in actual pattern shape (reduction in undercut) for the plasma C in the third stage.

Although the invention achieved by the inventors has been specifically described according to one example, the present invention should not be limited thereto, and it will be appreciated that various modifications or alterations may be made within the scope without departing from the gist of the present invention. For example, the above-described example has been described in detail to clearly explain the present invention, and the present invention is not necessarily limited to an embodiment having all the described configurations. Furthermore, a configuration of one example can be added to, eliminated from, or substituted for part of a configuration of another example.

REFERENCE SIGNS LIST

1 . . . plasma processing apparatus,
100 . . . vacuum chamber,
101 . . . substrate to be processed,
102 . . . shower plate,
103 . . . sample stage,
104 . . . plasma generating power source,
105 . . . mass flow controller,
106 . . . gas line,
107 . . . exhaust pipe,
108 . . . pressure control valve,
109 . . . pump,
111 . . . heater.

The invention claimed is:

1. A film formation method, comprising:
a first step of supplying a film forming gas into a vacuum processing chamber while generating plasma, and forming a film with the generated plasma on a surface of a substrate to be processed;
a second step of removing halogen with plasma after the first step; and
a third step of oxidizing or nitriding the film with plasma after the second step,
wherein a purge gas is also supplied for a first purge gas supply period during the first step, for a second purge gas supply period during the second step, and for a third purge gas supply period during the third step, wherein the first purge gas supply period in which the purge gas is supplied during the first step is longer than a plasma period of the first step,
wherein the second purge gas supply period in which the purge gas is supplied during the second step is longer than a plasma period of the second step,
wherein the third purge gas supply period in which the purge gas is supplied during the third step is longer than a plasma period of the third step,
wherein the first purge gas supply period, the second purge gas supply period, and the third purge gas supply period are discontinuous with respect to each other and are each separated by a high-vacuum state in which no gas is present in the vacuum processing chamber, and
wherein the plasma period of the first step, the plasma period of the second step, and the plasma period of the third step are each performed for respective different durations according to a relationship selected to prevent an undercut from being formed in a sidewall of a trench pattern of the film formed on the surface of the substrate.

2. The method according to claim 1,
wherein the film forming gas contains silicon and halogen.

3. The method according to claim 1,
wherein the first to third steps are repeated multiple times.

4. The method according to claim 1,
wherein time for the plasma processing in the first step is equal to or shorter than time for the plasma processing in the second step, and
time for the plasma processing in the second step is equal to or shorter than time for the plasma processing in the third step.

5. The method according to claim 4,
wherein the plasma processing time in the first step is within a range from 1 to 3 sec.

6. The method according to claim 1,
wherein pressure in the plasma processing in the first step and pressure in the plasma processing in the second step are each equal to or lower than pressure in the plasma processing in the third step.

7. The method according to claim 1,
wherein the film forming gas is tetrachlorosilane gas.

8. The method according to claim 7,
wherein the plasma used in the second step is generated using a gas containing hydrogen.

9. A film formation method, comprising:
a first step of supplying a film forming gas into a vacuum processing chamber for a predetermined time and then generating plasma, and forming a film with the generated plasma on a surface of a substrate to be processed;
a second step of removing halogen with plasma after the first step; and
a third step of oxidizing or nitriding the film with plasma after the second step,
wherein a purge gas is also supplied for a first purge gas supply period during the first step, for a second purge gas supply period during the second step, and for a third purge gas supply period during the third step,
wherein the first purge gas supply period in which the purge gas is supplied during the first step is longer than a plasma period of the first step,
wherein the second purge gas supply period in which the purge gas is supplied during the second step is longer than a plasma period of the second step, wherein the third purge gas supply period in which the purge gas is supplied during the third step is longer than a plasma period of the third step, wherein the first purge gas supply period, the second purge gas supply period, and the third purge gas supply period are discontinuous with respect to each other and are each separated by a high-vacuum state in which no gas is present in the vacuum processing chamber, and wherein the plasma period of the first step, the plasma period of the second step, and the plasma period of the third step are each performed for respective different durations according to a relationship selected to prevent an undercut from being formed in a sidewall of a trench pattern of the film formed on the surface of the substrate.

10. The method according to claim 9, wherein the film forming gas contains silicon and halogen.

11. The method according to claim 9, wherein the first to third steps are repeated multiple times.

12. The method according to claim 9, wherein time for the plasma processing in the first step is equal to or shorter than time for the plasma processing in the second step, and time for the plasma processing in the second step is equal to or shorter than time for the plasma processing in the third step.

13. The method according to claim 12, wherein the plasma processing time in the first step is within a range from 1 to 3 sec.

14. The method according to claim 9, wherein pressure in the plasma processing in the first step and pressure in the plasma processing in the second step are each equal to or lower than pressure in the plasma processing in the third step.

15. The method according to claim 9, wherein the film forming gas is tetrachlorosilane gas.

16. The method according to claim 15, wherein the plasma used in the second step is generated using a gas containing hydrogen.

17. A plasma processing method, comprising:
a first step of supplying a film forming gas into a vacuum processing chamber while generating plasma, and forming a film with the generated plasma on a surface of a substrate to be processed;
a second step of removing halogen with plasma after the first step;
a third step of oxidizing or nitriding the film with plasma after the second step; and
a fourth step of performing plasma etching on a film to be processed after the third step,
wherein a purge gas is also supplied for a first purge gas supply period during the first step, for a second purge gas supply period during the second step, and for a third purge gas supply period during the third step,
wherein the first purge gas supply period in which the purge gas is supplied during the first step is longer than a plasma period of the first step, wherein the second purge gas supply period in which the purge gas is supplied during the second step is longer than a plasma period of the second step, wherein the third purge gas supply period in which the purge gas is supplied during the third step is longer than a plasma period of the third step, wherein the first purge gas supply period, the second purge gas supply period, and the third purge gas supply period are discontinuous with respect to each other and are each separated by a high-vacuum state in which no gas is present in the vacuum processing chamber, and wherein the plasma period of the first step, the plasma period of the second step, and the plasma period of the third step are each performed for respective different durations according to a relationship selected to prevent an undercut from being formed in a sidewall of a trench pattern of the film formed on the surface of the substrate.

18. A plasma processing method, comprising:
a first step of supplying a film forming gas into a vacuum processing chamber for a predetermined time and then generating plasma, and forming a film with the generated plasma on a surface of a substrate to be processed;
a second step of removing halogen with plasma after the first step;
a third step of oxidizing or nitriding the film with plasma after the second step; and
a fourth step of performing plasma etching on a film to be processed after the third step,
wherein a purge gas is also supplied for a first purge gas supply period during the first step, for a second purge gas supply period during the second step, and for a third purge gas supply period during the third step,
wherein the first purge gas supply period in which the purge gas is supplied during the first step is longer than a plasma period of the first step,
wherein the second purge gas supply period in which the purge gas is supplied during the second step is longer than a plasma period of the second step,
wherein the third purge gas supply period in which the purge gas is supplied during the third step is longer than a plasma period of the third step,
wherein the first purge gas supply period, the second purge gas supply period, and the third purge gas supply period are discontinuous with respect to each other and are each separated by a high-vacuum state in which no gas is present in the vacuum processing chamber, and
wherein the plasma period of the first step, the plasma period of the second step, and the plasma period of the third step are each performed for respective different durations according to a relationship selected to prevent an undercut from being formed in a sidewall of a trench pattern of the film formed on the surface of the substrate.

* * * * *